United States Patent [19]

Gittinger et al.

[11] Patent Number: 5,897,659
[45] Date of Patent: Apr. 27, 1999

[54] MODIFYING RAS TIMING BASED ON WAIT STATES TO ACCOMMODATE DIFFERENT SPEED GRADE DRAMS

[75] Inventors: Robert P. Gittinger, Austin; James O. Mergard, Pflugerville, both of Tex.

[73] Assignee: Advanced Micro Devices, Inc., Sunnyvale, Calif.

[21] Appl. No.: 08/813,729

[22] Filed: Mar. 7, 1997

[51] Int. Cl.⁶ .................................................. G06F 12/00
[52] U.S. Cl. .......................... 711/167; 365/193; 365/203
[58] Field of Search .................................. 711/154, 167, 711/105; 365/203, 233, 193

[56] References Cited

U.S. PATENT DOCUMENTS

| | | | |
|---|---|---|---|
| 5,185,719 | 2/1993 | Dhong | 365/189.05 |
| 5,275,858 | 1/1994 | Oak et al. | 711/167 |
| 5,610,864 | 3/1997 | Manning | 365/193 |
| 5,634,112 | 5/1997 | Thome et al. | 711/154 |
| 5,636,367 | 6/1997 | Stones et al. | 711/167 |
| 5,649,161 | 7/1997 | Andrade et al. | 711/167 |
| 5,754,834 | 5/1998 | Yanagita | 395/551 |

OTHER PUBLICATIONS

Advanced Micro Devices, "Am186™EM and Am188™EM User's Manual with Am186 Instruction Definitions", 1995, pp. 1–1 thru 1–6; 2–1 thru 2–9; 3–1 thru 3–18; 4–1 thru 4–9; 5–1 thru 5–12; 6–1 thru 6–2; 7–1 thru 7–35; and 12–1 thru 12–6.

Advanced Micro Devices, "Am186™EM and Am188™EM High–Performance, 80C186– and 80C188–Compatible, 16–Bit Embedded Microcontrollers", 1996, pp. 29–48, 52–68, and 93–96.

Advanced Mciro Devices, "Am186™ES and AM188™ES High–Performance, 80C186– and 80C188–Compatible, 16–Bit Embedded Microcontrollers", 1996, pp. 24–52, and 65–75.

*Primary Examiner*—Tod R. Swann
*Assistant Examiner*—Christopher S. Chow
*Attorney, Agent, or Firm*—Zagorin, O'Brien & Graham, L.L.P.

[57] ABSTRACT

A DRAM control circuit accommodates different speed grade DRAMs by modifying the RAS strobe. A number of wait states are inserted into a DRAM access cycle, having a start time and an end time, between the start and the end time of the access cycle. When the number of wait states inserted is zero, the RAS is deasserted at a first time relative to the end of the access cycle. When the number of wait states is at least one, the RAS is deasserted at a second time, earlier than the first time, relative to the end time of the access cycle, thereby increasing the row address strobe precharge time.

14 Claims, 5 Drawing Sheets

FIG. 1 "PRIOR ART"

MODIFYING RAS TIMING BASED ON WAIT STATES TO ACCOMMODATE DIFFERENT SPEED GRADE DRAMS

CROSS-REFERENCE TO RELATED APPLICATIONS

This application relates to co-pending application Ser. No. 08/813,729 (pending) (Attorney Reference No: M-4800 US), entitled "INTEGRATING A DRAM CONTROLLER ONTO A MICROCONTROLLER", by Gittinger et al., filed the same day as the present application and which is incorporated herein by reference.

BACKGROUND OF THE INVENTION

1. Field of the Invention

This invention relates to accessing dynamic random access memories (DRAMS) and more particularly to modifying a row address strobe (RAS) for DRAMs based on the existence of waits states.

2. Description of the Related Art

DRAMs require a minimum amount of time (RAS precharge time) between active row address strobes. Referring to FIG. 1, that minimum time period 110 occurs where RAS is inactive (high). The time period is required because once RAS transitions to inactive, it must remain inactive for the minimum time shown at 110 to precharge the internal circuitry in the DRAM for the next active cycle. The RAS high time or precharge time varies according to the access speed of the DRAM. For example, a DRAM with 50 nanosecond access time can have a 30 ns RAS precharge time. A 60 ns DRAM can have a 35 ns precharge time and a DRAM with 70 ns access times can have a precharge time of 40 ns. Note that the use of the term "RAS" rather than " $\overline{\text{RAS}}$ " is for convenience and is not intended to suggest the active state of the signal.

When DRAM controllers control DRAMs with different access speeds, the DRAM controller must account for the different DRAM timing requirements. One such timing requirement, besides the RAS precharge requirement is the RAS pulse width shown in FIG. 1 as time period 120. In order to account for slower DRAMs, it is known to insert wait states in the DRAM access cycle so that the RAS and CAS strobes are extended. However, inserting wait states to extend the RAS active strobe does not solve the problem of having different RAS precharge (inactive or high time) requirements for DRAMs with different access speeds.

SUMMARY OF THE INVENTION

It has been discovered to provide a DRAM controller that modifies the RAS strobe by deasserting RAS earlier relative to the end of a DRAM access cycle when wait states are inserted in a DRAM bus cycle. The earlier deassertion of the row address strobe when wait states are inserted in the DRAM bus cycle relative to the end of the DRAM access cycle provides for a longer DRAM RAS precharge time (or high time) needed by slower DRAMs.

In one embodiment, the length of time that RAS is asserted is shortened by half a clock cycle relative to the end of the DRAM access cycle (T cycle) in order to increase the high time of RAS between deassertion and a subsequent assertion of RAS. That allows slower DRAMs with longer RAS high time requirements to be controlled by the same circuit that supports faster DRAMs. One benefit of modifying RAS as disclosed herein is that software does not have to configure the DRAM controller for RAS deassertion time. Also, there is no need to add an extra register to store the configuration for memory speed, thus making the DRAM controller smaller, easier to build and easier to program.

BRIEF DESCRIPTION OF THE DRAWINGS

The present invention may be better understood, and its numerous objects, features, and advantages made apparent to those skilled in the art by referencing the accompanying drawings wherein the use of the same reference symbol in different drawings indicates similar or identical items.

DESCRIPTION OF THE PREFERRED EMBODIMENT(S)

Figure 1:
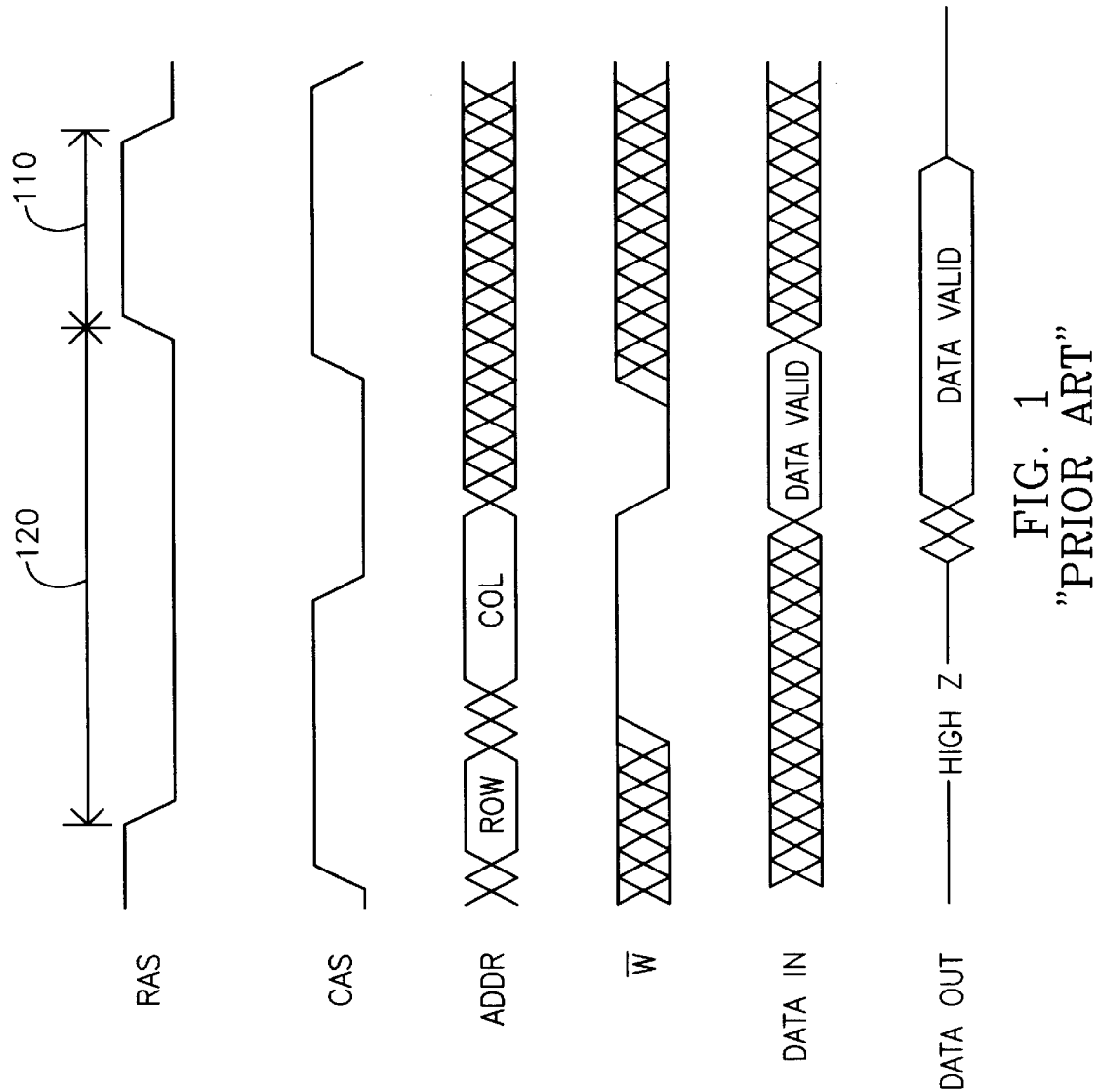
FIG. 1 is a timing diagram illustrating the RAS high time requirements.
Figure 2:
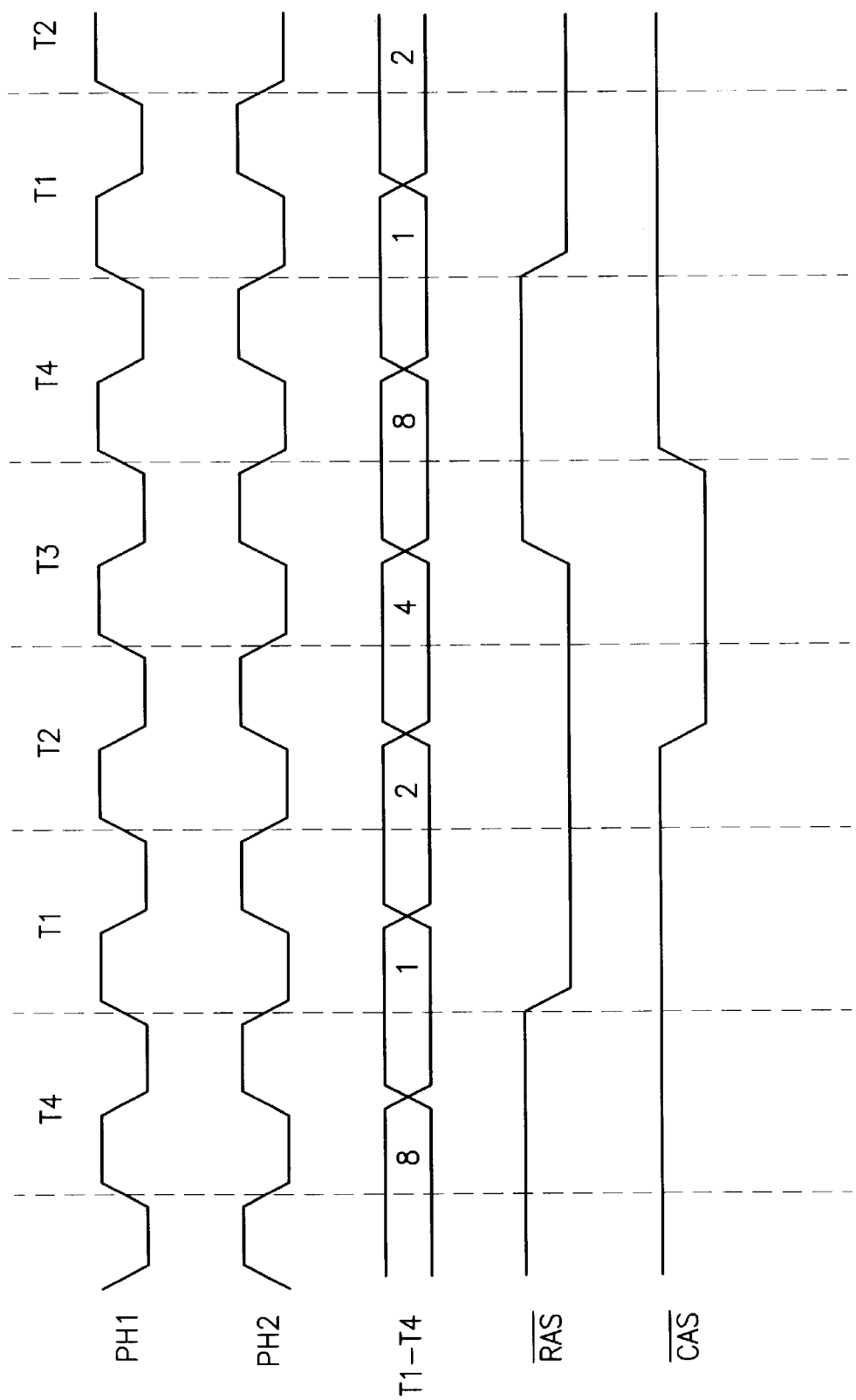
FIG. 2 is a timing diagram illustrating the RAS high time provided when no wait states are inserted according to one embodiment of the present invention.
Figure 3:
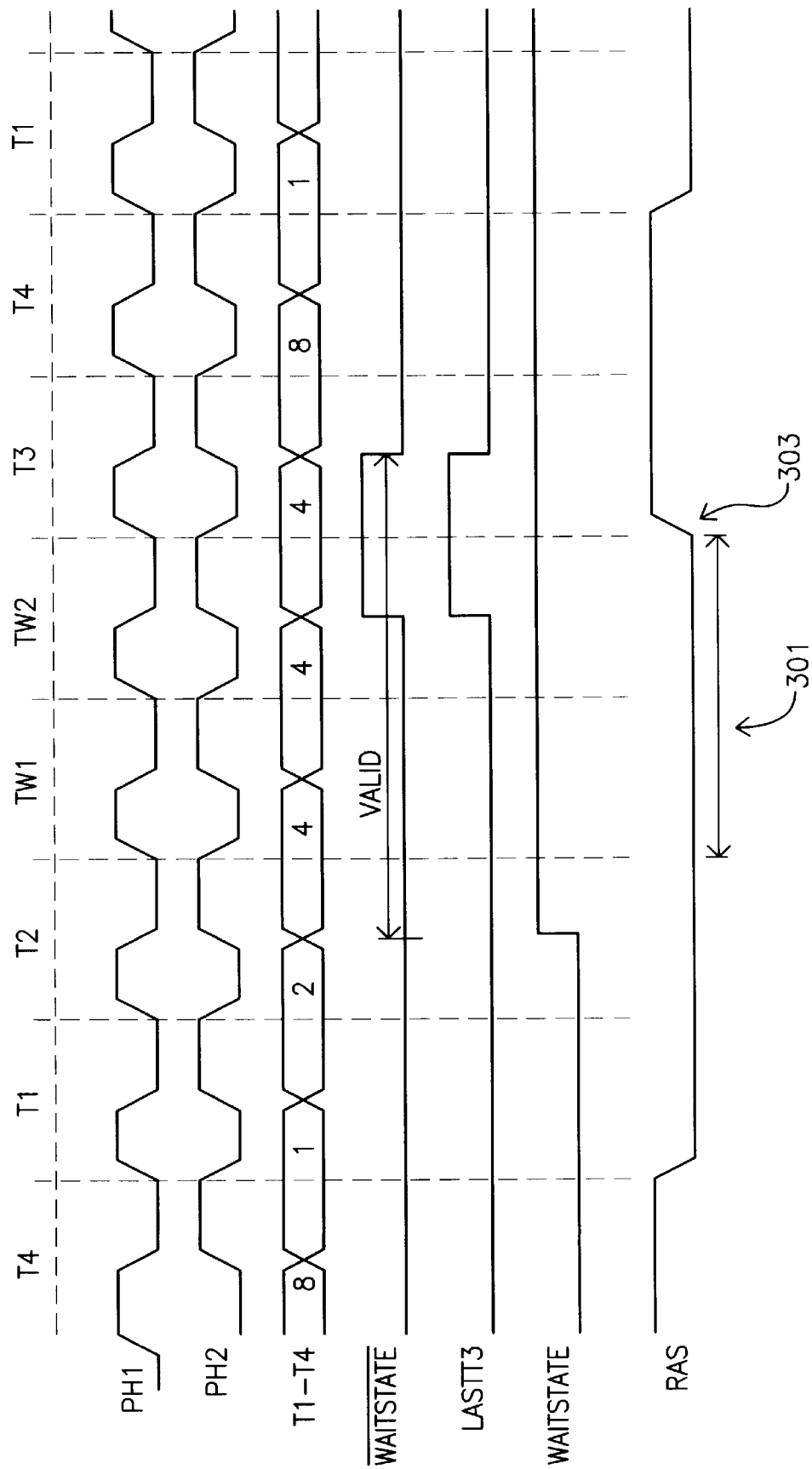
FIG. 3 shows the insertion of two wait states to extend the RAS cycle and the earlier deassertion of RAS to lengthen RAS high time.
Figure 4:
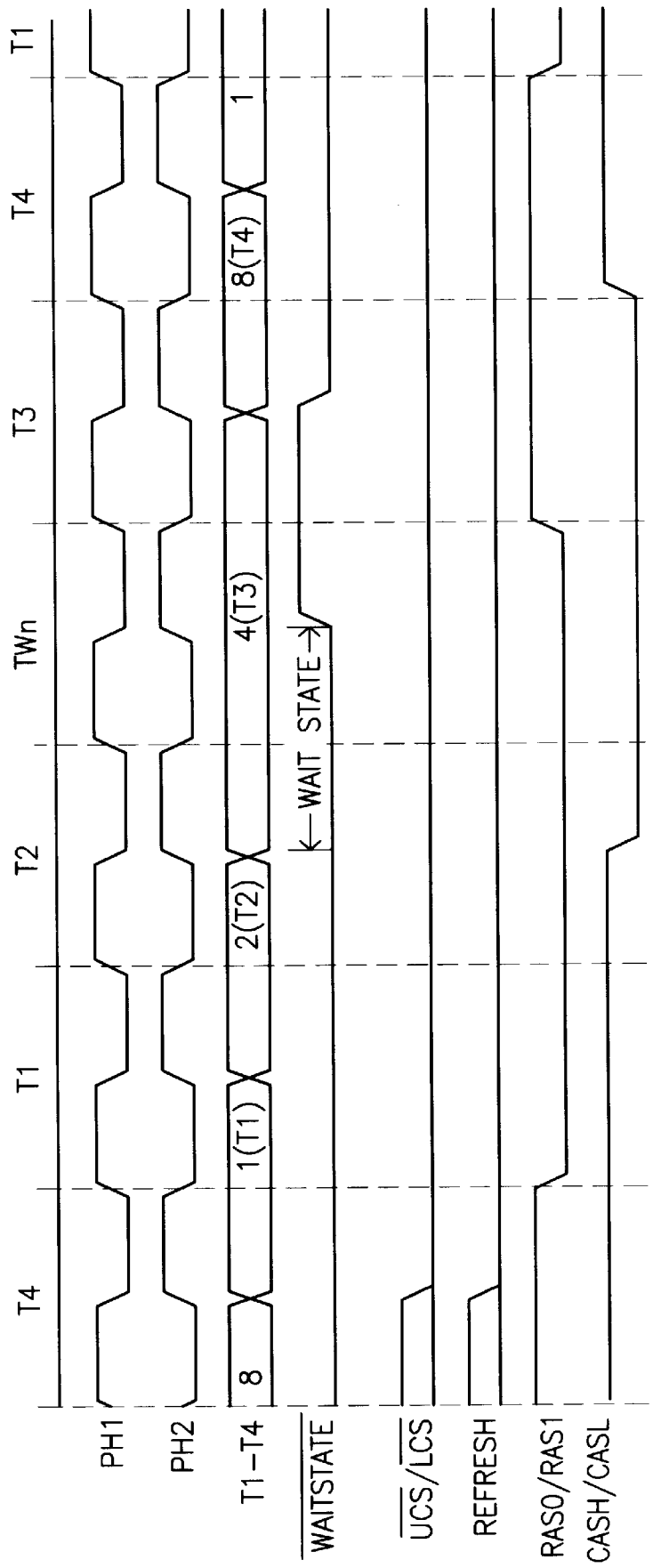
FIG. 4 shows the insertion of n wait states.

Referring to FIG. 2, a timing diagram illustrates the operation of a DRAM controller according to one embodiment of the present invention. FIG. 2 illustrates the operation of the DRAM controller when no wait states are inserted in the bus cycle. The timing diagram shows two clocks PH1 and PH2, which are nonoverlapping clocks of opposite phase. In the embodiment shown, each DRAM access cycle is divided into T cycles (T1–T4). The beginning of the DRAM access cycle is marked by the beginning of T1 and the end of the access cycle is defined by the end of T4. The particular T cycle that is occurring is provided on a four bit bus, with one bit indicating one T cycle. Thus, as shown in FIGS. 2, 3 and 4, T1 is indicated by a 1 on the four bits T1–T4, T2 by a 2, T3 by a 4 and T4 by an 8. RAS, is asserted during the T1 cycle on the rising edge of the PH1 clock. RAS lasts for two and a half T clock cycles (T1, T2 and half of T3) and is deasserted during the second half of T3 on the rising edge of the PH2 clock. RAS can be asserted again for the next access during the following T1 cycle. That provides for a RAS deassertion time of approximately 37.5 ns when the T clock period is 25 ns (40 MHz clock). That may be sufficient for a DRAM with, e.g., a 50 ns access time. However, when DRAMs with 60 or 70 ns are utilized, that deassertion time may not be sufficient. Accordingly, the deassertion time must be extended to meet the RAS high time requirements of the slower DRAMs. It is possible to wait extra T cycles when slower DRAMs are used but that would have the disadvantage of slowing down DRAM access and/or result in unique control logic for each speed grade DRAM supported along with a requirement to programmmably select which control logic to utilize according to the speed of the DRAM.

FIG. 3 illustrates an approach to support the longer RAS precharge time requirements of slower DRAMs that has less hardware and speed impact that the alternatives just mentioned. When slower DRAMs are utilized, the RAS active pulse width is also typically longer compared to the faster DRAMs. The longer pulse width requirement can be solved by adding wait states into the bus cycle. For example, FIG. 3 shows two wait states, TW1 and TW2, inserted in the bus cycle at 301. Wait states can be programmed into the DRAM controller by writing a value into a programmable register. The number of wait states corresponding to that value will be inserted into all DRAM access cycles at the end of T2, until the register is written with a different value. For example, in a DRAM controller incorporated into a '186 compatible microcontroller, two bits R1 and R0, can be provided in a programmable register (e.g., the upper memory chip select register) to determine the number of wait states to insert. For details on programming wait states for a DRAM controller incorporated in a '186 based microcontroller, see "INTEGRATING A DRAM CONTROLLER ONTO A MICROCONTROLLER", mentioned previously.

Because slower DRAMs, e.g., 60 nanosecond (ns) and 70 ns DRAMs, require more RAS high time for precharge between cycles than faster DRAMs, when wait states are inserted, as shown in FIGS. 3 and 4, the RAS signal is brought high in the first half of the T3 clock cycle. This occurs on the rising edge of PH1 at 303 rather than in the second half of the T3 cycle on the rising edge of PH2 as is done when there are no wait states. The deassertion of RAS earlier in the T3 cycle provides additional inactive time for RAS between cycles for the slower DRAMs. For certain DRAMs that additional time of half a T cycle (e.g. approximately 12.5 ns in one embodiment) is sufficient to provide the necessary precharge time for RAS so that the timing for the subsequent assertion of RAS in the next T1 cycle is the same for different speed grade DRAMs.

FIG. 4 shows another timing diagram with n wait states inserted. Other signals (UCS, LCS, RAS0, RAS1, and CASH, CASL) that are used in an embodiment in which a DRAM controller is integrated into a '186 microcontroller are also shown.

Figure 5A:
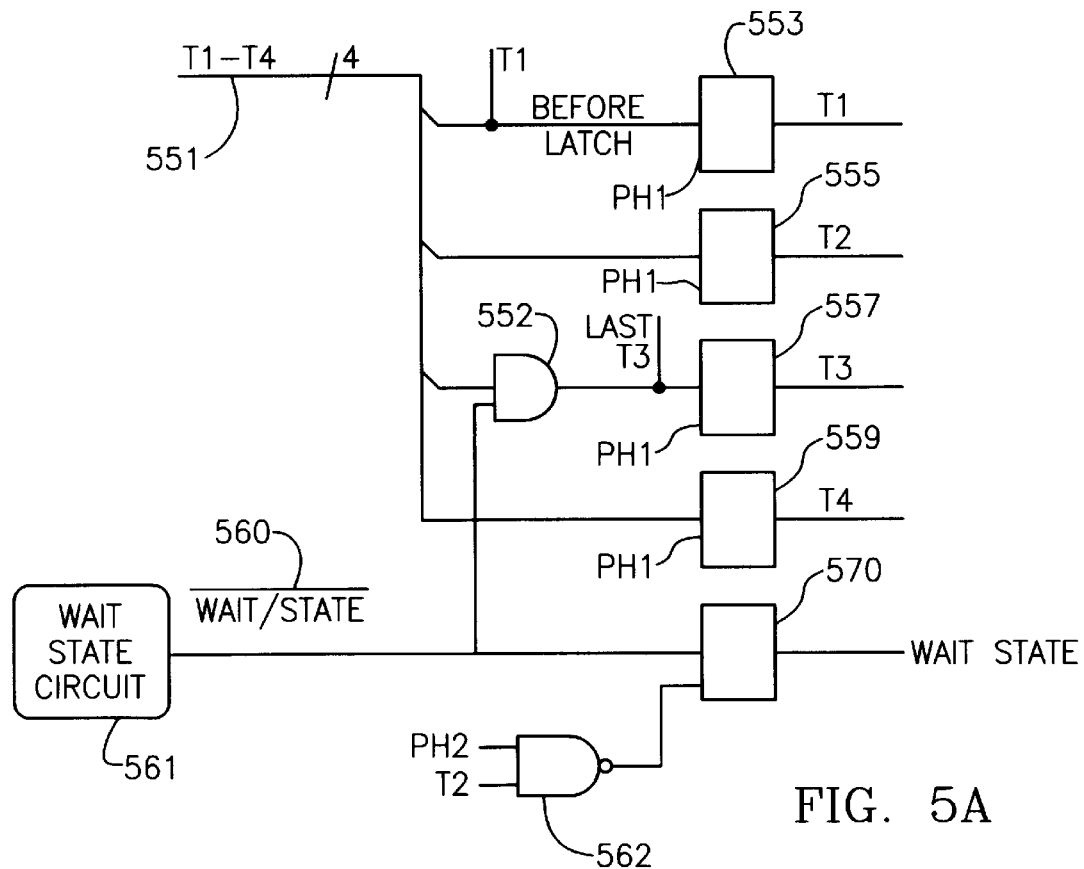
FIG. 5a shows a first part of a circuit used to control the deassertion of RAS based on the existence of wait states.
Figure 5B:
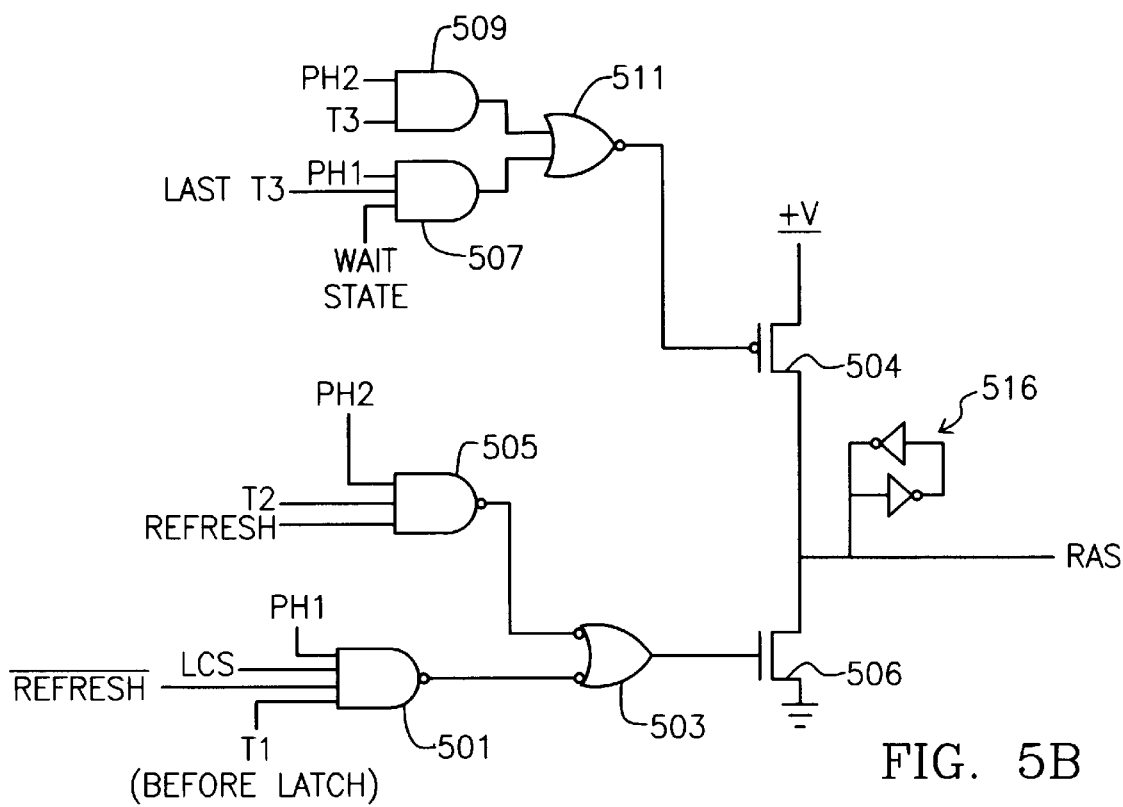
FIG. 5b shows a second part of the circuit of FIG. 5a used to control the deassertion of RAS based on the existence of wait states.

Referring to FIGS. 5a and 5b, a circuit to modify RAS timing when wait states are inserted in DRAM access cycle is shown. In one embodiment of the invention, when wait states are active, T3 is kept asserted on the T1–T4 signal lines. In other words, wait states extend the number of T3 cycles. A wait state circuit 561 may include a programmable register. The wait state circuit 561 extends the number of T3 cycles by the number of wait states in the programmable register when a valid DRAM access requiring wait states occurs and provides a signal 560 indicating the existence of wait states.

The RAS is generated by the circuit in FIGS. 5a and 5b in accordance with the timing diagrams of FIGS. 2, 3 and 4. Gate 501 causes transistor 506 to switch on during PH1 of T1 when refresh is not active and lower memory chip select (LCS) is asserted. Lower memory chip select (LCS) is a signal in a '186 microcontroller that is asserted when an address within a programmable memory block is being accessed. In another embodiment of the invention, the LCS signal may instead be a signal indicating that a DRAM access is taking place. Gate 505 is used to assert RAS when refresh is active. When no wait states are present in the DRAM access bus cycle, gate 509 will go high on the rising edge of PH2 of T3 causing transistor 504 to switch on, thus deasserting RAS, as shown in FIG. 2. The T1–T4 signals 551, are respectively latched in latches 553, 555, 557 and 559.

However, when wait states are active, then T3 will be blocked by gate 552 whose output is low when $\overline{\text{WAIT STATE}}$ is asserted. The $\overline{\text{WAIT STATE}}$ signal shown in FIG. 3 is available on the rising edge of PH2, which is one half T cycle before the T cycle actually begins a wait state. That ensures that the signal indicating the next wait state is available and stable on the rising edge of PH1. The $\overline{\text{WAIT STATE}}$ signal is only valid during T3 cycles when a value of 4 is on the T1–T4 bits as shown in FIG. 3. When there are no wait states as shown in FIG. 2, $\overline{\text{WAIT STATE}}$ is inactive (high) during PH2 of T2 and PH1 of T3. Referring to FIG. 3, $\overline{\text{WAIT STATE}}$ is valid and active (low) from the rising edge of PH2 in T2 until the rising edge of PH2 in the last wait state (ere TW2). At the rising edge of PH2 in TW2, $\overline{\text{WAIT STATE}}$ goes inactive and remains that way until the rising edge of PH2 in T3 at which point the signal is not valid for the purposes of the circuit shown in FIGS. 5a and 5b. When $\overline{\text{WAIT STATE}}$ is deasserted on the rising edge of PH2, in the last wait state cycle as shown in FIGS. 3 and 4, the "last T3" signal goes active indicating that the next T cycle is the last T3. WAIT STATE from latch 570 is still high because it was latched during T2. Thus gate 507 becomes high on the rising edge of PH1 during T3, causing RAS to be deasserted at that time as shown in FIG. 4. Remember that wait states may be programmably set in one or more registers. When no wait states are inserted, $\overline{\text{WAIT STATE}}$ rises on PH2 of T2 to indicate an inactive state and deasserts on PH2 of T3.

With a circuit such as the one described in FIGS. 5a and 5b, the insertion of wait states during a DRAM access cycle, causes the logic controlling deassertion of RAS to deassert RAS earlier relative to the end of the T4 cycle. In the particular embodiment shown, the deassertion was a half a T cycle earlier. In other embodiments, the time of the earlier deassertion will depend upon the clocks used in the DRAM controller and the requirements of the slower DRAM. Thus, for instance, in other embodiments, RAS may be deasserted, e.g., a whole cycle earlier or a quarter cycle earlier, than the end of the DRAM access cycle, as long as other timing requirements of the DRAMs are met.

The description of the invention set forth herein is illustrative, and is not intended to limit the scope of the invention as set forth in the following claims. For instance the invention may be utilized in a microcontroller on which a DRAM controller is integrated or may be used on any DRAM controller. Variations and modifications of the embodiments disclosed herein, may be made based on the description set forth herein, without departing from the scope and spirit of the invention as set forth in the following claims.

What is claimed is:

1. A method of accommodating different speed grade DRAMs in a DRAM control circuit, comprising:

inserting a number of wait states into a DRAM access cycle, the DRAM access cycle having a start time and an end time, the number of wait states being inserted between the start and the end time of the access cycle;

deasserting a row address strobe at a first time relative to the end of the access cycle when the number of wait states is zero; and deasserting the row address strobe at a second time, earlier than the first time, relative to the end time of the access cycle, when the number of wait states is at least one, thereby increasing the row address strobe precharge time.

2. The method as recited in claim 1 wherein the number of wait states inserted is programmable.

3. The method as recited in claim 2 wherein the number of wait states is between 0 and 3.

4. The method as recited in claim 1, further comprising asserting the row address strobe at a fixed time relative to the start time of the access cycle for all number of wait states.

5. The method as recited in claim 1 wherein the first time is coincident with a rising edge of a first clock signal and wherein the second time is coincident with a rising edge of a second clock signal, the first and second clock signals being of opposite phase.

6. A method of operating a DRAM control circuit accommodating different speed grade DRAMs, comprising:

asserting a row address strobe (RAS) at a first time relative to a start time of a first DRAM access cycle when a number of wait states inserted in the access cycle is zero and when the number of wait states inserted in the first DRAM access cycle is non-zero;

deasserting the row address strobe at a first time relative to an end of the first DRAM access cycle when no wait states are inserted in the first DRAM access cycle;

deasserting the row address strobe at a second time earlier than the first time, relative to the end of the first DRAM access cycle, when the number of wait states inserted in the access cycle is non-zero, thereby extending a precharge time for a next DRAM access cycle; and asserting a row address strobe (RAS) at the first time relative to a start time of the next DRAM access cycle when the number of wait states inserted in the first DRAM access cycle is zero and when the number of wait states inserted in the first DRAM access cycle is non-zero.

7. The method as recited in claim 6, further comprising:

asserting the row address strobe at the beginning of a first clock period of a plurality of clock periods defining the DRAM access cycle, when wait states are inserted in the DRAM access cycle and when wait states are not inserted in the DRAM access cycle.

8. The method as recited in claim 7 further comprising:

deasserting the row address strobe during a middle of a predetermined one of the plurality of clock periods when no wait states are inserted in the DRAM access cycle; and extending the row address strobe by an extra clock period for each wait state inserted, each extra clock period being inserted be fore the predetermined clock period; and deasserting the row address strobe at the beginning of the predetermined clock period when one or more wait states are inserted in the DRAM access cycle.

9. The method as recited in claim 7, wherein the plurality of clock periods are the first, a second, a third and a fourth clock period, and the predetermined clock period is the third clock period.

10. A DRAM control circuit accommodating different speed grade DRAMs, comprising:

means for deasserting a row address strobe at a first time relative to an end of a DRAM access cycle when no wait states are inserted in the DRAM access cycle; and means for deasserting the row address strobe at a second time earlier than the first time, relative to the end of the DRAM access cycle, when at least one wait state is inserted, thereby increasing the row address strobe precharge time.

11. The DRAM control circuit as recited in claim 10 further comprising means for asserting the row address strobe at a fixed time relative to a start time of the DRAM access cycle for all number of wait states.

12. The DRAM control circuit as recited in 11 further comprising a programmable register indicating a number of wait states to insert in the DRAM access cycle.

13. A DRAM control circuit accommodating different speed grade DRAMs, comprising:

a row access strobe (RAS) assertion circuit coupled to a RAS signal line, the RAS assertion circuit being responsive to signals indicative of a start of a DRAM access cycle, to assert the RAS signal line at a fixed time relative to a start of a DRAM access cycle; and a RAS deassertion circuit coupled to the RAS signal line and responsive to a wait state signal indicative of a wait state being inserted in the access cycle, to deassert the RAS signal line at a first time relative to the end of the DRAM access cycle when the wait state signal is not asserted and at a second time earlier than the first time, relative to the end of the DRAM access cycle, when the wait state signal is asserted.

14. A DRAM control circuit as recited in claim 13, wherein, the RAS assertion circuit is coupled to receive at least one clock signal and at least one DRAM access control signal and is coupled to provide a first switch signal at a fixed time relative to a start of a DRAM access cycle, the RAS assertion circuit further including, a first switch coupled to the row access strobe (RAS) signal line, the first switch being responsive to the first switch signal to assert the RAS signal line at the fixed time relative to the start of the DRAM access cycle; and wherein the RAS deassertion circuit is coupled to receive clocks signals and control signals, the deassertion circuit being coupled to output a second switch signal indicating to deassert the RAS signal line at a first time relative to the end of the DRAM access cycle when the wait state signal is not asserted and at a second time earlier than the first time, relative to the end of the DRAM access cycle, when the wait state signal is asserted, the RAS deassertion circuit including a second switch coupled to the RAS signal line, the second switch being responsive to the second switch signal to deassert the RAS signal line.

* * * * *